United States Patent
Beyer et al.

(10) Patent No.: US 8,198,152 B2
(45) Date of Patent: Jun. 12, 2012

(54) TRANSISTORS COMPRISING HIGH-K METAL GATE ELECTRODE STRUCTURES AND ADAPTED CHANNEL SEMICONDUCTOR MATERIALS

(75) Inventors: Sven Beyer, Dresden (DE); Jan Hoentschel, Dresden (DE); Thilo Scheiper, Dresden (DE); Uwe Griebenow, Markkleeberg (DE)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 12/917,700

(22) Filed: Nov. 2, 2010

(65) Prior Publication Data
US 2011/0210398 A1 Sep. 1, 2011

(30) Foreign Application Priority Data
Feb. 26, 2010 (DE) .......................... 10 2010 002 450

(51) Int. Cl.
*H01L 21/8234* (2006.01)
*H01L 21/8238* (2006.01)
*H01L 21/336* (2006.01)
*H01L 21/425* (2006.01)
*H01L 21/38* (2006.01)

(52) U.S. Cl. ........ 438/199; 438/197; 438/287; 438/481; 438/514; 438/561; 257/E21.453; 257/E21.444; 257/E21.409

(58) Field of Classification Search ........... 257/E21.453, 257/E21.444, E21.409
See application file for complete search history.

(56) References Cited

U.S. PATENT DOCUMENTS

| | | | | |
|---|---|---|---|---|
| 6,251,763 B1 * | 6/2001 | Inumiya et al. | ............... | 438/595 |
| 6,303,418 B1 * | 10/2001 | Cha et al. | ...................... | 438/199 |
| 6,348,385 B1 * | 2/2002 | Cha et al. | ...................... | 438/287 |
| 7,361,565 B2 * | 4/2008 | Shin et al. | ...................... | 438/303 |
| 7,399,663 B2 | 7/2008 | Hoentschel et al. | .......... | 438/151 |
| 7,586,153 B2 * | 9/2009 | Hoentschel et al. | .......... | 257/344 |
| 2004/0137688 A1 * | 7/2004 | Chang et al. | .................. | 438/303 |
| 2006/0046399 A1 * | 3/2006 | Lindert et al. | ............... | 438/282 |
| 2007/0202641 A1 * | 8/2007 | Wei et al. | ...................... | 438/194 |
| 2008/0023692 A1 * | 1/2008 | Wirbeleit et al. | ............... | 257/19 |
| 2009/0218597 A1 * | 9/2009 | Liu et al. | ....................... | 257/192 |
| 2009/0294860 A1 * | 12/2009 | Mowry et al. | ................. | 257/368 |
| 2010/0133628 A1 * | 6/2010 | Frohberg et al. | ............... | 257/410 |

FOREIGN PATENT DOCUMENTS
DE 102005052055 B3 4/2007

OTHER PUBLICATIONS

Translation of Official Communication from German Patent Office for German Patent Application No. 10 2010 002 450. 3 dated Mar. 30, 2011.

* cited by examiner

*Primary Examiner* — Mohsen Ahmadi
(74) *Attorney, Agent, or Firm* — Williams, Morgan & Amerson, PC

(57) ABSTRACT

In sophisticated semiconductor devices, a replacement gate approach may be applied, in which a channel semiconductor material may be provided through the gate opening prior to forming the gate dielectric material and the electrode metal. In this manner, specific channel materials may be provided in a late manufacturing stage for different transistor types, thereby providing superior transistor performance and superior flexibility in adjusting the electronic characteristics of the transistors.

14 Claims, 10 Drawing Sheets

TRANSISTORS COMPRISING HIGH-K METAL GATE ELECTRODE STRUCTURES AND ADAPTED CHANNEL SEMICONDUCTOR MATERIALS

BACKGROUND OF THE INVENTION

1. Field of the Invention

Generally, the present disclosure relates to the fabrication of sophisticated integrated circuits including transistor elements comprising high-k metal gate electrode structures.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions represented by an interface that is formed by highly doped regions, referred to as drain and source regions, and by a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the electronic characteristics of the channel regions, such as dopant concentration, band gap, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the base material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. It turns out that decreasing the channel length requires an increased capacitive coupling between the gate electrode and the channel region to avoid the so-called short channel behavior during transistor operation. Thus, the thickness of the silicon dioxide layer has to be correspondingly reduced to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics, at least in part, as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would otherwise be obtained by an extremely thin silicon dioxide layer.

Additionally, transistor performance may be increased by providing an appropriate conductive material for the gate electrode so as to replace the usually used polysilicon material, at least in the vicinity of the gate dielectric material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals may be formed so as to connect to the high-k dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration and the performance characteristics thereof has to be guaranteed when using metal-containing electrode materials.

Providing different metal species for adjusting the work function of the gate electrode structures for P-channel transistors and N-channel transistors at an earlier manufacturing stage, may, however, be associated with a plurality of difficulties arising from the fact that a complex patterning sequence may be required during the formation of the sophisticated high-k metal gate stack. For this reason, significant variations of the resulting work functions and thus threshold voltages of the completed transistor structures may be generated. In other approaches, so-called replacement gate approaches, the gate electrode structures are provided with a high degree of compatibility with conventional patterning regimes, for instance based on polysilicon, and the high-k dielectric material and the metal-containing materials for adjusting the appropriate work functions and providing a high conductivity are incorporated in a very late manufacturing stage, i.e., after completing the basic transistor structure and thus after any high temperature processes, which may have a significant influence on the resulting characteristics of sophisticated high-k metal gate electrode structures in process strategies, in which the sensitive high-k materials in combination with the metal-containing electrode materials are provided in an early manufacturing stage.

In addition to providing sophisticated high-k metal gate electrode structures, other mechanisms are typically implemented in transistors in order to increase the overall performance, for instance in terms of the electronic characteristics of the channel region. It is well known that the channel region may have a significant influence on the overall transistor characteristics, such as threshold voltage, leakage current, drive current capability and the like. For example, the energy levels of the channel material in combination with the work function of the gate electrode material and the degree of dopant concentration may determine the threshold voltage, thereby requiring specific metal-containing electrode materials in combination with sophisticated treatments in order to adjust a proper work function for the various types of transistors in complex semiconductor devices. Consequently, by providing a specific type of semiconductor material, in particular in the channel region, an increased flexibility may be achieved in selecting appropriate electrode materials when forming sophisticated gate electrode structures. For example, frequently, upon providing the sophisticated high-k metal gate electrode structures in an early manufacturing stage, typically a silicon/germanium alloy may be formed on the silicon active region in order to provide a desired band gap offset, which may thus allow appropriately defining a work function in combination with a corresponding electrode metal, which may be appropriate for withstanding the subsequent high temperature process upon completing the basic transistor configuration. Furthermore, the type and concentration of dopants in the channel region may also influence the threshold voltage, wherein, however, an increased dopant concentration provided by ion implantation may result in increased charge carrier scattering, which in turn may reduce the drive current capability of the transistor. Furthermore, it is well known that the charge carrier mobility in the channel region may be efficiently modified by inducing a strained state therein, which may be accomplished by various strain-inducing mechanisms, such as providing an embedded strained semiconductor material in the drain and source regions, thereby inducing a desired strain component in the channel region. In other cases, highly stressed materials, such as sidewall spacers of the gate electrode structures, material layers provided in a contact level of the device and the like, may be provided in order to induce a desired strain component in the channel region, wherein, however, the strain transfer efficiency may significantly depend on process strategies, device configuration and the like.

Consequently, upon implementing sophisticated high-k metal gate electrode structures, typically, the interaction with additional performance-enhancing mechanisms may have a significant influence on the final transistor characteristics, wherein the conventional process strategies may result in a less pronounced performance enhancement as desired. For example, in approaches in which the high-k metal gate electrode structure may be provided in an early manufacturing phase, by using a silicon/germanium alloy for adjusting the threshold voltage of one type of transistors, a pronounced difference in surface topography may be caused between P-channel transistors and N-channel transistors due to the epitaxial growth of the silicon/germanium material selectively on the active regions of the P-channel transistors, which, however, may result in significant patterning-related non-uniformities of the resulting gate electrode structures. Furthermore, in these approaches, the adjustment of the work function is a very complex process and may result in significant threshold variability due to the fact that the gate electrode structure may experience the complex subsequent process flow, for instance for forming drain and source regions based on the corresponding high temperature processes. On the other hand, well-established replacement gate approaches may provide superior uniformity of transistor characteristics, for instance in terms of threshold voltage, wherein, however, the complex process for replacing placeholder material in a late manufacturing stage may result in a strong interaction with other performance-enhancing mechanisms, such as strain-inducing mechanisms, while a reduced flexibility in adjusting the overall electronic characteristics of the channel region may result in a less pronounced gain in performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which the characteristics of a channel region may be adjusted with superior flexibility when applying a replacement gate approach for providing a sophisticated high-k metal gate electrode structure. To this end, upon replacing a placeholder material, a specifically selected semiconductor material may be formed on or in an exposed portion of the semiconductor region of at least one transistor type, prior to forming a gate dielectric material and a metal-containing electrode material in the corresponding gate opening. Consequently, by forming a desired channel semiconductor material in a late manufacturing stage, desired characteristics, for instance in terms of strain state, band gap offset, dopant concentration and the like, may be efficiently adjusted without having to expose the channel semiconductor material to sophisticated process conditions, such as elevated temperatures and the like. In this manner, an efficient threshold voltage adjustment may be accomplished, possibly in combination with providing additional mechanisms, such as an appropriately adapted band gap and/or a desired strain state and/or a desired dopant concentration and the like. Furthermore, by forming the channel semiconductor material in this manufacturing stage, a self-aligned process is achieved, in which the channel semiconductor material may be laterally embedded, for instance, by corresponding sidewall spacer structures of a gate electrode structure and/or by semiconductor material of the semiconductor region, if a corresponding recess may be formed prior to growing the additional channel semiconductor material. In some illustrative aspects disclosed herein, channel semiconductor materials may be provided for different types of transistors, such as N-channel transistors and P-channel transistors, wherein the corresponding channel semiconductor material may differ in at least one material characteristic, such as strain state, material composition, dopant concentration and the like, which may thus result in superior flexibility in specifically adjusting the characteristics of different types of transistors. For instance, new exotic channel semiconductor materials, such as gallium arsenide and the like, may be provided, for instance, selectively in some transistors, thereby providing the possibility to increase channel strain and charge carrier mobility, while also enabling an efficient adaptation of the threshold voltages. On the other hand, the basic transistor configuration may be completed by using well-established process strategies based on a conventional gate electrode structure, which may be patterned in accordance with any appropriate process strategy. Furthermore, if desired, by providing a recess prior to growing the channel semiconductor material, a superior connection to the drain and source regions, i.e., drain and source extension regions, may be accomplished, while also, if desired, a desired high strain component may be generated, thereby even further enhancing current drive capability of the transistor.

One illustrative method disclosed herein comprises forming a gate electrode structure of a transistor on a semiconductor region, wherein the gate electrode structure comprises a placeholder material. The method further comprises removing the placeholder material so as to form a gate opening and forming a channel semiconductor material on a portion of the semiconductor region through the gate opening. Additionally, the method comprises forming a gate dielectric material on the channel semiconductor material and forming an electrode material above the gate dielectric material within the gate opening.

A further illustrative method disclosed herein relates to forming a semiconductor device. The method comprises forming a first channel semiconductor material on a portion of a first semiconductor region through a first opening that is formed in a first gate electrode structure. The method additionally comprises forming a second channel semiconductor material on a portion of a second semiconductor region through a second opening that is formed in a second gate electrode structure, wherein the first and second channel semiconductor materials differ in at least one material characteristic. Moreover, the method comprises forming a gate dielectric material and an electrode material in the first and second openings.

One illustrative semiconductor device disclosed herein comprises a semiconductor region comprising an epitaxially grown channel region that is laterally embedded between drain and source regions, wherein the channel region differs from the drain and source regions in a doping level and in material composition. Additionally, the semiconductor device comprises a gate electrode structure formed on a top surface of the channel region, wherein the gate electrode structure comprises a metal-containing electrode material and a high-k dielectric material formed above the channel region, and wherein the high-k dielectric material is formed so as to laterally enclose the metal-containing electrode material.

BRIEF DESCRIPTION OF THE DRAWINGS

The disclosure may be understood by reference to the following description taken in conjunction with the accompanying drawings, in which like reference numerals identify like elements, and in which.

Figure 1A:
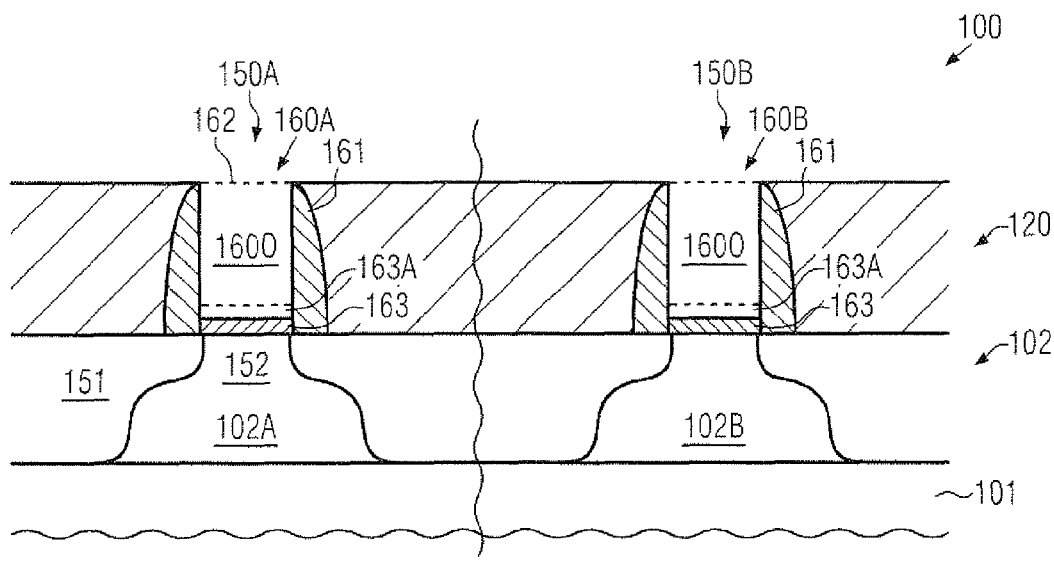
FIGS. 1a-1m schematically illustrate cross-sectional views of a semiconductor device during various manufacturing stages, when applying a replacement gate approach in one or more transistors and incorporating a specifically designed channel semiconductor material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the present disclosure, sophisticated gate electrode structures may be provided on the basis of a replacement gate approach, wherein a channel semiconductor material may be formed on a portion of the active region of one or more types of transistors after removing any placeholder material of the gate electrode structure. In this manner, a desired type of semiconductor material may be positioned in a self-aligned manner within the active region of a transistor under consideration, thereby providing the possibility of specifically adjusting the electronic characteristics of the conductive channel of the transistor under consideration. For example, if considered appropriate, a recess may be formed in the active region through the gate opening so as to laterally embed the epitaxially grown new channel semiconductor material between the drain and source regions, thereby providing a superior connection of the channel region to the drain and source regions. Furthermore, any type of semiconductor material may be formed as long as an epitaxial growth on the basic semiconductor material of the active region is ensured. For example, any appropriate material or material compositions, such as gallium arsenide, silicon, silicon/germanium, silicon/carbon and the like, may be formed at a location in which a conductive channel builds up upon transistor operation. Consequently, the band structure of the channel semiconductor material may be specifically selected so as to obtain the desired electronic characteristics, for instance, for adjusting charge carrier mobility, threshold voltage of the transistor in combination with the work function of the gate electrode structure and the like. Moreover, the material composition may be selected such that a desired strained state of the semiconductor material may be achieved, thereby also contributing to superior conductivity of the channel region. In some illustrative embodiments, the channel semiconductor material may be provided in an appropriately pre-doped manner so that a specific dopant type and profile may be incorporated into the channel region without creating crystalline defects, which are typically associated with implantation processes. Consequently, the complexity of incorporating a well-dopant species may be reduced, for instance, by omitting one or more implantation steps, thereby contributing to a reduced process complexity in addition to superior performance of the transistor devices. In this respect, it should be appreciated that the term material composition is to be understood to refer to any atomic species that are present in a fraction that corresponds to at least 0.5 atomic percent of the entire semiconductor material, so that dopants may not be considered as a part of the material composition. For example, in a silicon/germanium alloy, the fraction of germanium and silicon may each be greater than a typical dopant concentration and may thus be considered as a specific material composition, irrespective of the doping profile and type of dopants contained therein.

FIG. 1a schematically illustrates a semiconductor device 100 in an advanced manufacturing stage. As illustrated, the device 100 may comprise a substrate 101 in combination with a semiconductor layer 102, which may represent any appropriate semiconductor material, such as silicon, silicon/germanium and the like. The semiconductor layer 102 and the substrate 101 may constitute a bulk configuration, i.e., the semiconductor layer 102 may represent a portion of a crystalline material of the substrate 101, while, in other cases, a buried insulating material (not shown) may be provided below the semiconductor layer 102, thereby forming an SOI (semiconductor- or silicon-on-insulator) configuration. The semiconductor layer 102 may comprise a plurality of semiconductor regions or active regions 102A, 102B, in and above which transistors 150A, 150B, respectively, may be provided.

It should be appreciated that the active regions 102A, 102B may be laterally delineated in the semiconductor layer 102 by any appropriate isolation structure (not shown), such as a shallow trench isolation and the like. The transistors 150A, 150B may represent transistors of different characteristics, for instance in terms of threshold voltage, conductivity type, drive current capability and the like. For example, the transistor 150A may represent a P-channel transistor, while the transistor 150B may represent an N-channel transistor. It should be appreciated, however, that the transistors 150A, 150B may also represent transistors of the same conductivity type, which may require different transistor characteristics, such as a different threshold voltage, as may be required in complex semiconductor devices. The transistors 150A, 150B may comprise drain and source regions 151 having any appropriate lateral and vertical dopant profile as required, wherein, if required, any metal silicide regions (not shown) may also be provided. Furthermore, the transistors 150A, 150B may comprise gate electrode structures 160A, 160B, respectively, which may comprise a sidewall spacer structure 161 of any appropriate configuration, in combination with a gate dielectric material 163, which, however, may act as an etch stop material in the gate electrode structures 160A, 160B, while, in other device areas (not shown), the dielectric material 163 may act as actual gate dielectrics, if considered appropriate. Moreover, in some illustrative embodiments, an additional etch stop material 163A may be provided, if the etch resistivity of the dielectric materials 163 is considered inappropriate for the further processing of the device 100. For instance, the dielectric material 163A may be provided in the form of silicon dioxide, silicon nitride and the like. The gate electrode structures 160A, 160B may comprise openings 160O, which have been formed by removing a placeholder material 162, such as polysilicon and the like. The gate electrode structures 160A, 160B may be laterally embedded in a dielectric material 120, such as silicon dioxide, silicon nitride and the like.

The semiconductor device 100 as illustrated in FIG. 1a may be formed on the basis of the following processes. The active regions 102A, 102B may be formed in the semiconductor layer 102 by providing corresponding isolation structures, which may be accomplished by applying well-established lithography, etch, deposition and planarization techniques for forming shallow trench isolations. Prior to or after forming the isolation structures, corresponding implantation processes may be applied so as to incorporate a well dopant species in the active regions 102A, 102B, wherein, as discussed above, any well dopant species may be incorporated into a channel area 152 in a later manufacturing stage, when forming a channel semiconductor material through the gate openings 160O. Next, the gate electrode structures 160A, 160B may be formed by providing the dielectric material 163, for instance by oxidation, deposition and the like, wherein, in some illustrative embodiments, a thickness and material composition of the material 163 may be selected such that sufficient etch stop capabilities may be provided during the further processing, i.e., upon forming the channel semiconductor material and providing the high-k dielectric materials and electrode materials. In other cases, a thickness of the dielectric material 163 may be selected in accordance with well-established process margins in order to provide a high degree of compatibility in patterning the gate layer stack to be formed above the material 163 on the basis of established sophisticated patterning strategies. Next, the placeholder material 162, for instance in the form of amorphous silicon, polysilicon and the like, may be deposited, possibly in combination with additional materials, such as dielectric cap materials, hard mask materials and the like. Subsequently, the layer stack may be patterned by using any appropriate process strategy and the processing may be continued by forming the drain and source regions 151 in combination with the spacer structure 161, which may have any appropriate configuration in terms of individual spacer elements, etch stop liners and the like. For example, silicon dioxide, silicon nitride and the like are well-established dielectric materials for forming the spacer structure 161. Based on appropriate implantation sequences, in combination with appropriate masking regimes, the drain and source regions 151 may be provided with a desired vertical and lateral dopant profile so as to appropriately connect to the channel area 152. Furthermore, any anneal processes may be performed to activate dopant species and re-crystallize implantation-induced damage. Next, a metal silicide (not shown), if required, may be formed in the drain and source regions 151 by applying any appropriate silicidation technique. Thereafter, the dielectric material 120 may be deposited and may be planarized so as to expose the placeholder material 162. In the embodiment shown, an etch process may be performed to remove the material 162 in both gate electrode structures 160A, 160B in a common removal process, while, in other embodiments, as will be described later on, the gate openings 160O may be formed in a sequential process strategy. The placeholder material 162 may be removed by any appropriate etch process, for instance, based on wet chemical etch recipes in the form of TMAH (tetra methyl ammonium hydroxide), potassium hydroxide and the like, while, in other cases, in addition to or alternatively, plasma-assisted etch recipes may be used, wherein the material 163 may act as an efficient etch stop material. Next, the dielectric material 163A may be formed, if required, for instance, by deposition or by oxidation, depending on the overall process strategy.

Figure 1B:
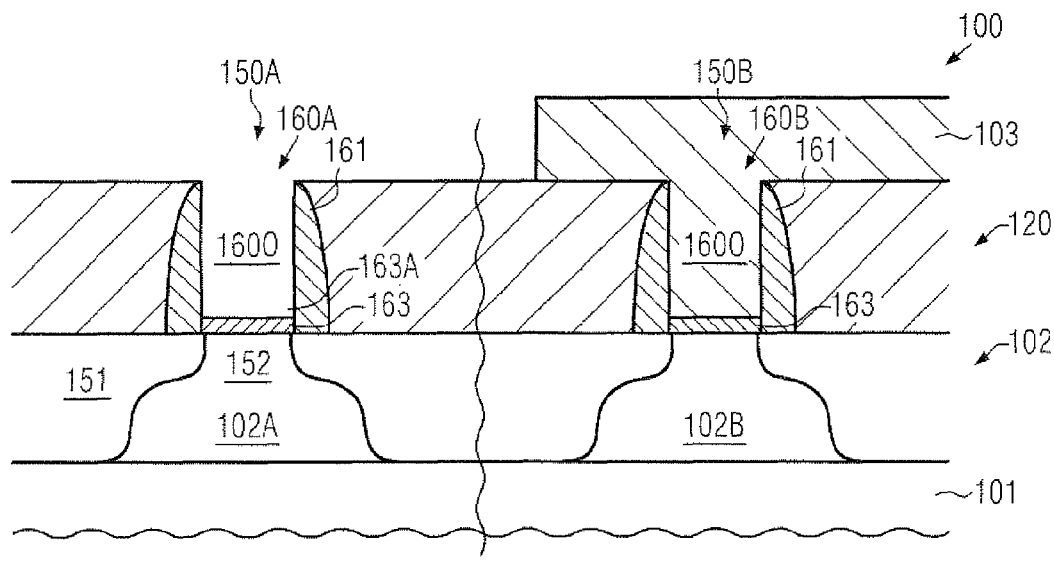

FIG. 1b schematically illustrates the semiconductor device 100 with an etch mask 103 formed above the transistor 150B, thereby covering and thus filling the opening 160O of the gate electrode structure 160B. To this end, any appropriate material, such as a resist material, a polymer material and the like, may be used in accordance with appropriate lithography techniques.

Figure 1C:
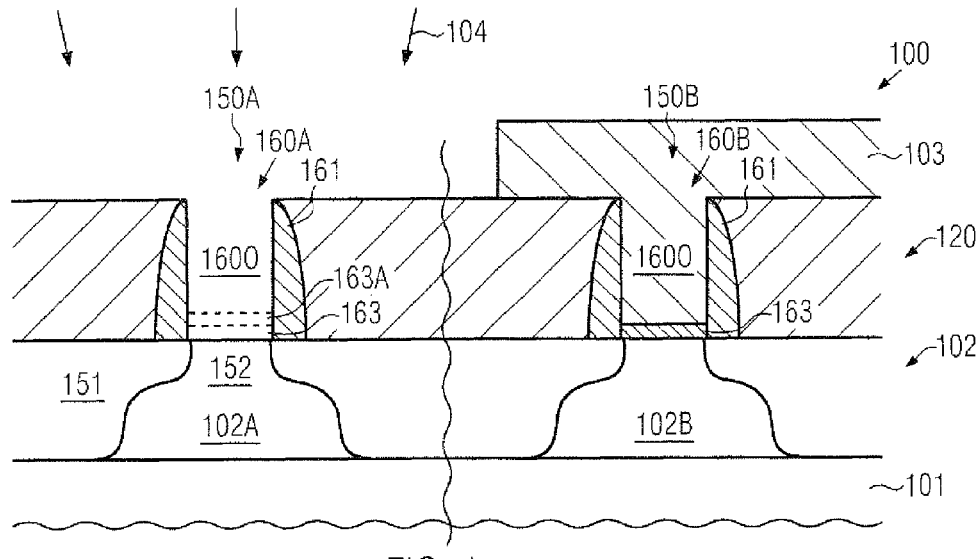

FIG. 1c schematically illustrates the device 100 when exposed to a reactive etch ambient 104, which may be appropriately configured so as to remove the material 163 and 163A, if provided, within the gate opening 160O of the gate electrode structure 160A. For this purpose, a plurality of well-established etch chemistries, such as wet chemical etch recipes in the form of hydrofluoric acid and the like, may be applied, when the material 163 and the material 163A are comprised of silicon dioxide. In other cases, any other appropriate etch chemistry may be applied. In other cases, the etch process 104 may be performed as a plasma-assisted etch process on the basis of well-established etch recipes. During the etch process 104, the spacer structure 161 may act as an efficient etch stop material, thereby substantially maintaining the initial length of the gate electrode structure 160A. Similarly, the material 120 may act as an etch stop material or any material erosion in the layer 120 may be negligible with respect to the further processing, since the layers 163, 163A may have a thickness that may be sufficiently etched without unduly affecting the material 120. Consequently, during the etch process 104, the portion 152, also referred to as the channel area, may be exposed within the gate opening 160O of the gate electrode structure 160A.

Figure 1D:
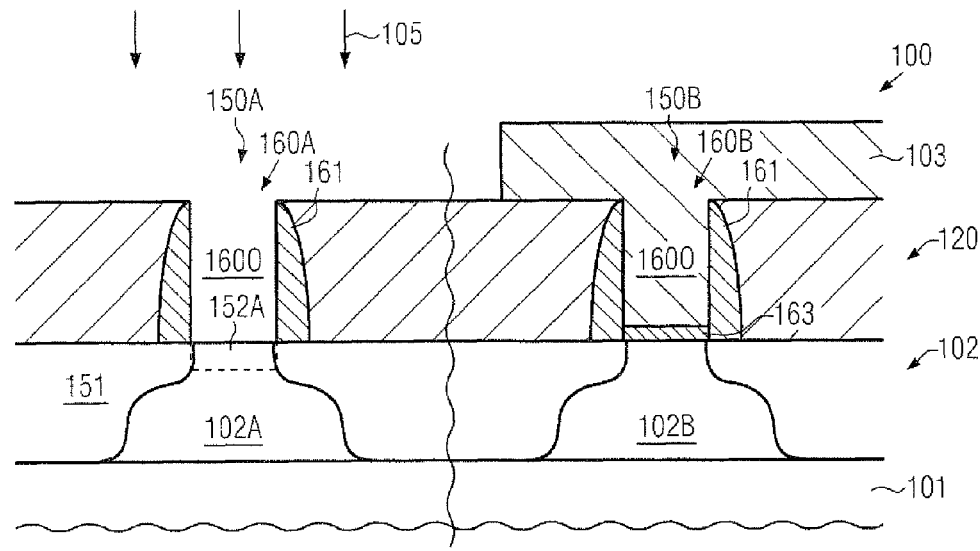

FIG. 1d schematically illustrates the device 100 according to illustrative embodiments in which a further etch process 105 may be applied, or in which the etch process 104 of FIG. 1c may be appropriately continued so as to form a recess 152A in the active region 102A. To the end, the etch process 105 may be performed on the basis of appropriate process parameters in order to determine the size and shape of the recess 152A in accordance with device requirements. For example, the process 105 may be performed on the basis of a plasma with a pronounced anisotropic etch behavior, thereby transferring the lateral dimensions of the gate opening 160O into the semiconductor region 102A when forming the recess 152A. For this purpose, well-established etch recipes are available, as are also used for patterning silicon-based gate electrode structures. In other cases, if a certain degree of under-etching may be required, respective process parameters may be selected during the process 105, which may be accomplished by using wet chemical etch recipes or plasma-assisted etch recipes. In other cases, the recess 152A may be formed by oxidizing a portion of the semiconductor material 102A and removing the oxidized portion on the basis of highly selective etch chemistries, such as hydrofluoric acid and the like. Consequently, during the etch process 105, the recess 152A may be provided with any desired size and shape so as to provide superior connection to the drain and source regions 151 after filling in an appropriate channel semiconductor material.

Figure 1E:
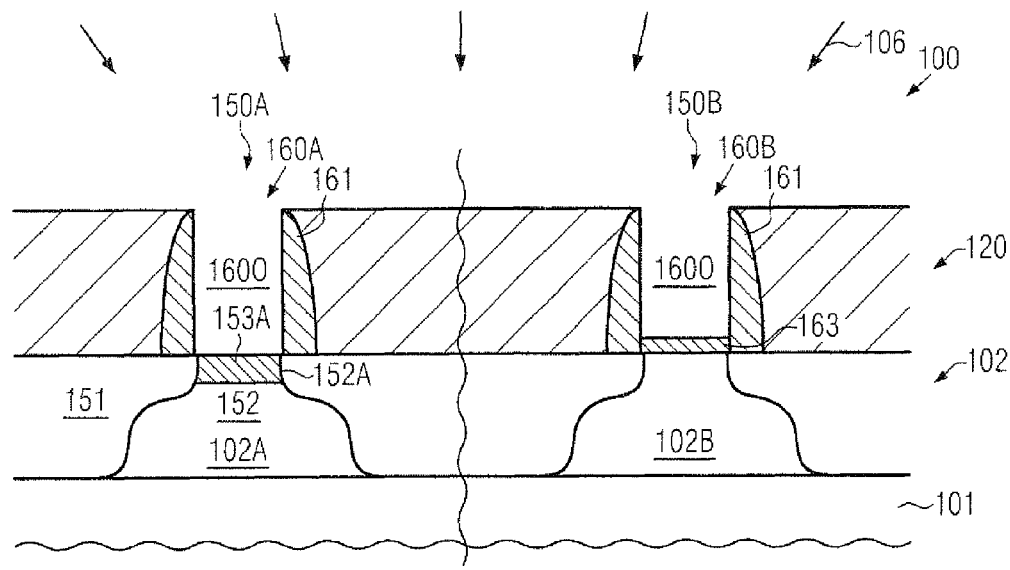

FIG. 1e schematically illustrates the device 100 in a further advanced manufacturing stage, i.e., after the removal of the etch mask 103 (FIG. 1d) and during a selective epitaxial growth process 106. As is well known, a selective epitaxial growth process may be performed on the basis of process parameters in which the deposition of a semiconductor material may be substantially restricted to exposed semiconductor surface areas, while a significant material deposition on other surface areas, such as dielectric surface areas, may be restricted. Consequently, during the process 106, a channel semiconductor material 153A having specific characteristics may be selectively formed on the portion 152 of the active region 102A exposed by the gate opening 160O of the gate electrode structure 160A, while a significant material deposition in the gate electrode structure 160B may be suppressed by the dielectric material 163. In the embodiment shown, the semiconductor material 153A may be formed within the recess 152A so that the material 153A may be laterally embedded from the initial semiconductor material of the region 102A and may thus appropriately connect to the drain and source regions 151. The material 153A may be provided with a desired material composition so as to specifically enhance performance of the transistor 150A. To this end, the material composition of the material 153A may be selected to enhance charge carrier mobility in the material 153A, which may also be referred to as the channel region, which may be accomplished by providing a certain strain, such as compressive or tensile strain. For example, a silicon/germanium material may be formed with a compressive strain, when grown on a silicon template material due to the mismatch in lattice constants between a pure silicon material and a silicon/germanium mixture. Similarly, other silicon-based semiconductor alloys, such as a silicon/carbon material, may be provided so as to obtain a tensile strained state, if required. Furthermore, in addition or alternatively to a strained state, the overall band structure of the material 153A may be selected so as to provide superior transistor performance. For example, a silicon/germanium material may per se have a reduced band gap and thus increased carrier conductivity compared to pure silicon material. Furthermore, in combination with a gate dielectric material and a metal-containing electrode material still to be formed in the gate electrode structure 160A, the threshold voltage of the transistor 150A may be adjusted, wherein superior flexibility in selecting appropriate materials for the material 153A and any metal-containing electrode material for the gate electrode structure 160A. For instance, any exotic materials may be provided due to the fact that, in particular, any high temperature processes may no longer be required upon further processing the device 100, thereby enabling a stable transistor configuration, even for semiconductor materials that would otherwise result in significant irregularities when provided in an earlier manufacturing stage. For example, gallium arsenide and corresponding related semiconductor materials may be formed during the process 106, as long as a crystalline growth may be ensured without unduly affecting the overall lattice structure in the semiconductor region 102A.

Furthermore, if required, during the epitaxial growth process 106, an appropriate dopant species may also be incorporated into the deposition atmosphere at any appropriate phase of the process 106, thereby providing an in situ doping of the material 153A or at least of a portion thereof. Consequently, during the deposition process 106, a specific well dopant species may be incorporated in the semiconductor region 102A, however, substantially without creating additional crystal damage as may be associated with the incorporation of a well dopant species by ion implantation.

It should be appreciated that the material 153A may be provided with varying characteristics, for instance in terms of basic material composition and dopant concentration, by appropriately adjusting or changing process parameters during the process 106. For example, any excess material may be provided during the process 106, for instance for forming a mask material on the basis of oxidation, if desired. Moreover, even individual material layers of different material composition may be deposited to form the channel semiconductor material 153A, if considered appropriate in terms of enhancing overall performance of the transistor 150A.

Figure 1F:
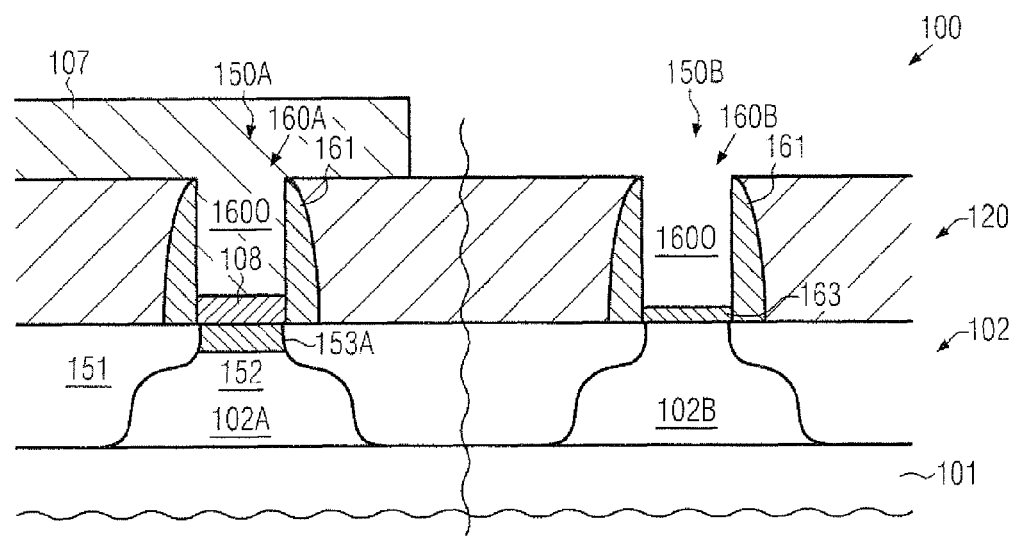

FIG. 1*f* schematically illustrates the semiconductor device 100 in a manufacturing stage in which a hard mask material 108 may be formed above the channel semiconductor material 153A and may be comprised of any appropriate dielectric material, such as an oxide material, silicon nitride and the like. Moreover, an etch mask 107 may be provided, if required, so as to cover the mask material 108, while exposing the gate electrode structure 160B and thus the dielectric material 163 formed therein. It should be appreciated that the mask 107 may be omitted if the material 108 and the material 163 may have a significantly different etch behavior during the subsequent processing of the device 100.

Figure 1G:
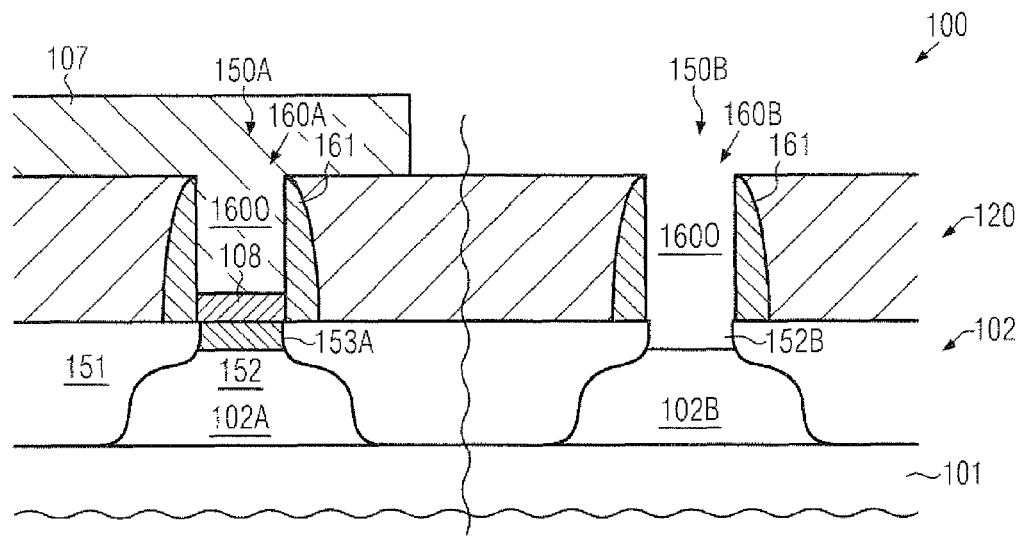

FIG. 1*g* schematically illustrates the device 100 in a further advanced manufacturing stage in which the material 163 (FIG. 1*f*) is removed so as to expose a portion of the active region 102B. In the embodiment shown, a recess 152B may be provided in the active region 102B, if considered appropriate for the further processing of the device 100. It should be appreciated that the exposure of a portion of the semiconductor region 102B may be specifically designed in accordance with requirements of the transistor 150B and, if provided, also the recess 152B may be selected in size and shape in accordance with the overall characteristics of the transistor 150B. With respect to any process strategies for removing the dielectric material and, if required, for forming the recess 152B, it may be referred to the above-described process strategies.

Figure 1H:
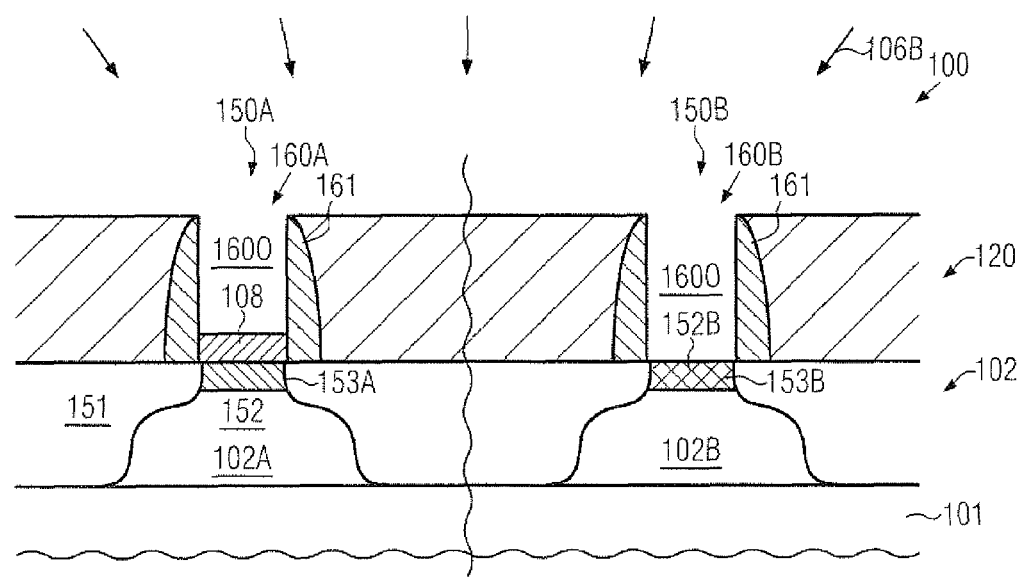

FIG. 1*h* schematically illustrates the device 100 during a further selective epitaxial growth process 106B, in which a desired channel semiconductor material 153B may be formed on a portion of the active region 102B, such as in the recess 152B, while a significant material deposition in the gate electrode structure 160A may be suppressed by the mask 108. Consequently, during the growth process 106B, the material 153B may be deposited with any desired characteristics in terms of material composition, strain state, in situ doping and the like so as to comply with the requirements of the device 150B. After the deposition of the material 153B, the mask layer 108 may be removed, for instance, by using selective wet chemical etch recipes, such as hydrofluoric acid and the like, depending on the material composition of the layer 108. As previously discussed, if a certain material erosion may also occur in the material 153B, it may be provided with a certain degree of extra height.

Figure 1I:
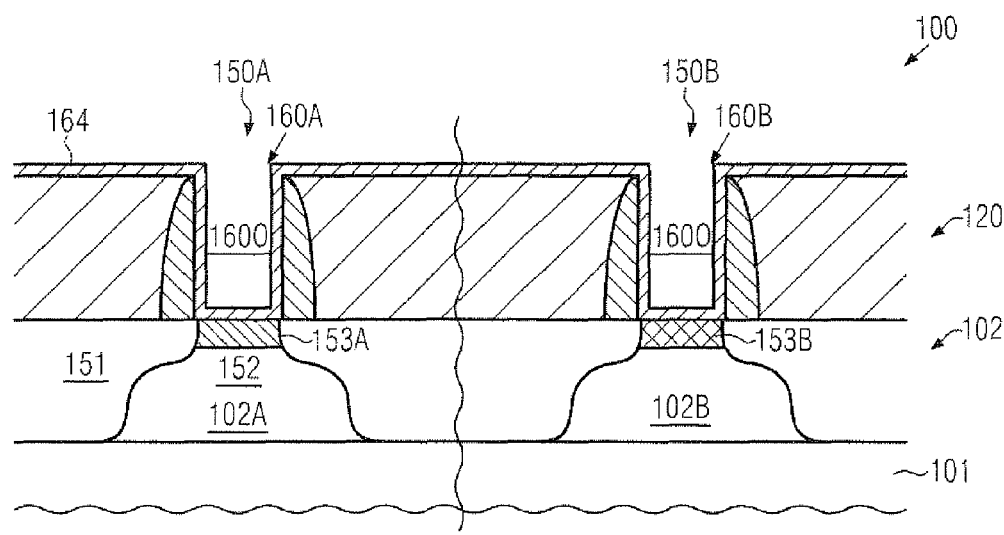

FIG. 1*i* schematically illustrates the device 100 with a gate dielectric material 164 formed within the gate openings 160O and on the dielectric material 120. Thus, the dielectric material 164 may be formed on the semiconductor materials 153A, 153B, respectively, which may thus represent the channel regions of the transistors 150A, 150B, respectively. The dielectric material 164 may be provided in the form of any appropriate dielectric material, possibly including a conventional dielectric material, such as silicon dioxide, silicon oxynitride and the like, with a desired thickness, for instance, in the range of 0.5-1 nm. Moreover, the material 164 may comprise a high-k dielectric material, such as a hafnium oxide based material, a zirconium oxide based material and the like, which may be provided as a dedicated material layer (not shown) in combination with a conventional dielectric material, if required. In other cases, a high-k dielectric material may be directly formed on the materials 153A, 153B, thereby providing superior capacitive coupling, while, on the other hand, the characteristics of the materials 153A, 153B may be selected such that any negative effect of a direct deposition of a high-k material may be reduced. In still other illustrative embodiments, a conventional interface may be formed locally on the materials 153A and/or 153B by performing an appropriate surface treatment, such as oxidation and the like. It should be appreciated that appropriate deposition techniques for forming a high-k dielectric material in a highly conformal manner are well established and may be used for forming the material 164 having the desired composition and layer thickness.

Figure 1J:
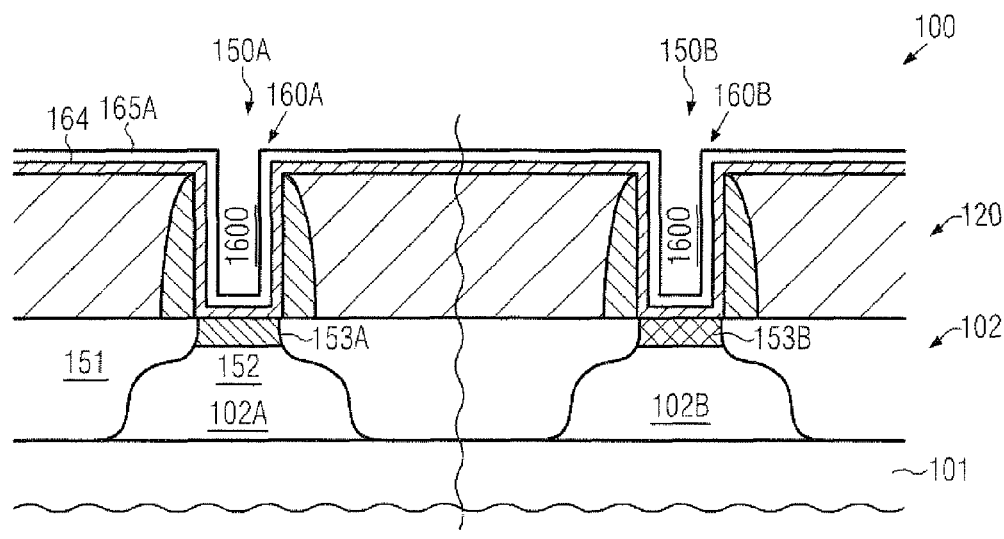

FIG. 1*j* schematically illustrates the device 100 in a further advanced manufacturing stage, in which a metal-containing electrode material 165A may be formed in the gate openings 160O of the gate electrode structures 160A, 160B and also above the dielectric material 120. To this end, any material or materials may be deposited by well-established deposition techniques, such as sputter deposition, chemical vapor deposition (CVD) and the like, wherein the one or more materials of the layer 165A may provide the desired work function in the threshold voltage in combination with the channel semiconductor material 153A. For example, the layer 165A may comprise aluminum, titanium, tantalum and the like, possibly in combination with additional work function adjusting species, wherein a high degree of flexibility in selecting appropriate conductive materials may be achieved, since a desired adaptation in band gap offset and the like may be accomplished on the basis of the channel material 153A. In some illustrative embodiments, the material 165A may be appropriate for achieving a desired threshold voltage for both the transistor 150A and the transistor 150B, when the characteristics of the material 153B may ensure an appropriate adaptation with respect to band gap offset and the like. In other illustrative embodiments, the material 165A may be selectively removed from the gate electrode structure 160B.

Figure 1K:
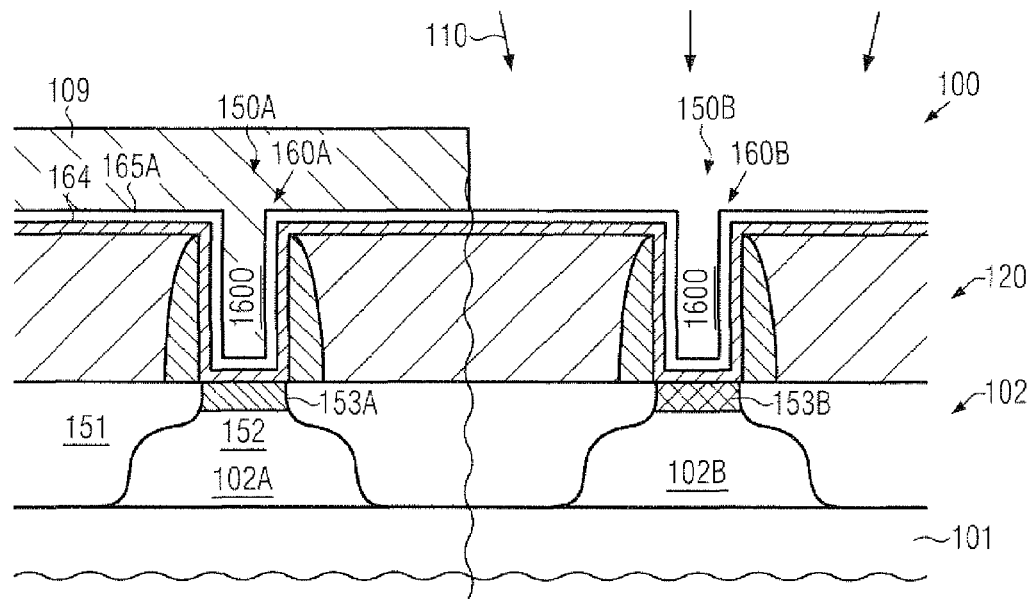
Figure 1L:
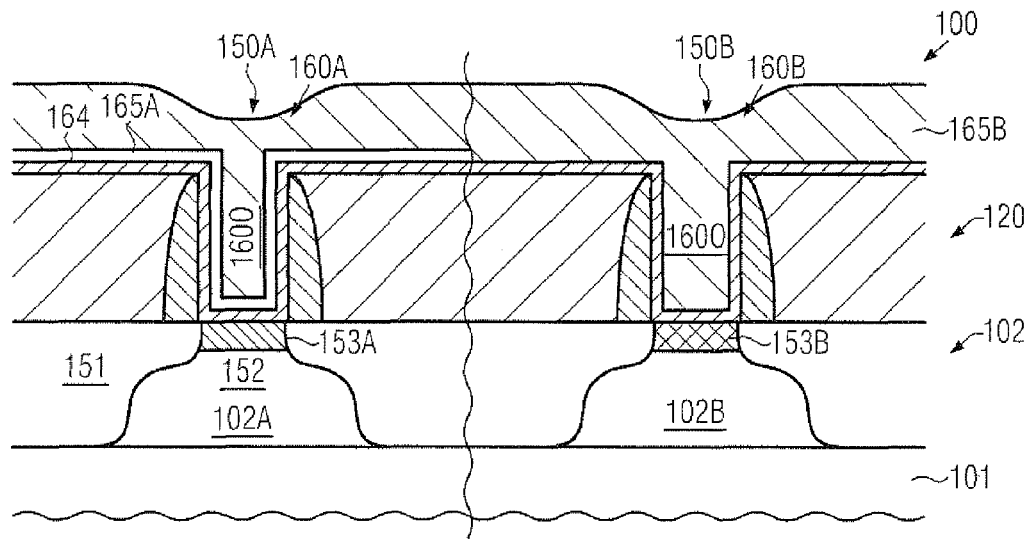

FIG. 1*k* schematically illustrates the device 100 when exposed to a reactive etch ambient 110 for removing a portion of the electrode material 165A that is exposed by an etch mask 109. Hence, the material 165A may be removed from above the transistor 150B and thus from within the gate electrode structure 160B, wherein the dielectric material 164 may act as an efficient etch stop material. The etch process 110 may be established on the basis of well-established wet chemical etch chemistries using hydrofluoric acid, hydrogen peroxide and the like. Thereafter, the etch mask 109, which may be provided in the form of a resist material or any other organic material, may be removed by using well-established etch strategies.

FIG. 11 schematically illustrates the semiconductor device 100 in a further advanced manufacturing stage. As illustrated, a further electrode material 165B may be provided, which may be appropriate for defining the transistor characteristics, such as threshold voltage, for the transistor 150B, in combination with the material 153B. On the other hand, the electrode material 165A may suppress or at least significantly reduce any influence of the material 165B on the electrical performance of the gate electrode structure 160A. As previously explained, if a corresponding adaptation of electronic characteristics may be achieved on the basis of the materials 153A, 153B, the same material or materials may be used in the gate electrode structures 160A and 160B, thereby reducing overall process complexity. The material 165B may be deposited on the basis of any appropriate deposition technique, such as CVD, sputter deposition, electrochemical deposition, possibly in combination with the deposition of a seed material, and the like. For example, the material 165B may be provided in the form of aluminum, copper, tungsten and the like.

Figure 1M:
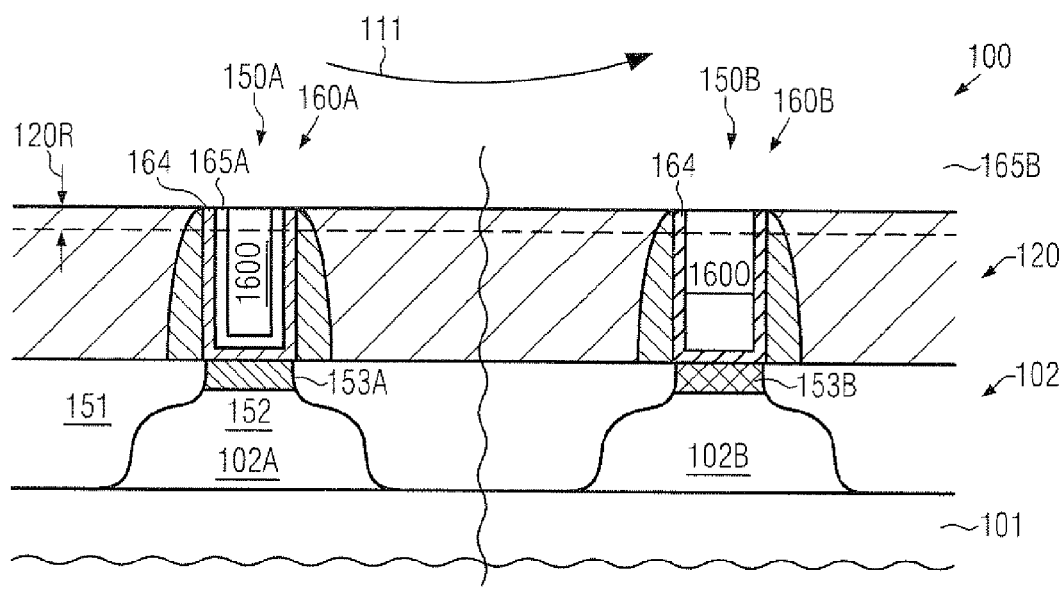

FIG. 1m schematically illustrates the semiconductor device 100 in a further advanced manufacturing stage in which a removal process 111 may be performed to remove any excess material so as to provide the gate electrode structures 160A, 160B as electrically isolated features. For this purpose, the removal process 111 may comprise any appropriate process, such as a polishing process in the form of a chemical mechanical polishing (CMP) process and the like. During the removal process 111, any surface topography in the layer 120, which may have been caused during the previous processing providing the materials 153A, 153B including the formation and removal of corresponding hard mask materials and the like, may also be efficiently enhanced, thereby also removing any metal residuals which may have been formed in corresponding recesses upon deposition of the materials 165A, 165B. Thus, the final gate height may be adjusted during the process 111, as indicated by 120R, so as to reliably remove any metal residues on the dielectric material 120.

Consequently, the transistors 150A, 150B may comprise the gate electrode structures 160A, 160B including the gate dielectric material 164, which may comprise a high-k dielectric material, in combination with an appropriate metal-containing electrode material, such as the material 165A, for the gate electrode structure 160A, and the material 164 for the gate electrode structure 160B. Furthermore, the transistors 150A, 150B may comprise the channel regions 153A, 153B, respectively, which may provide a superior strain state and/or band gap offset and/or superior dopant profiling and/or superior threshold voltage adjustment, and the like, as is also previously explained. Thus, superior transistor performance may be accomplished on the basis of a replacement gate approach due to the late fabrication of an epitaxially grown channel material having desired electrical and mechanical characteristics. It should be appreciated that the principles disclosed herein may be applied to a single transistor type only, for instance in semiconductor devices in which one conductivity type of transistors may be provided. In other cases, other transistors may be appropriately covered throughout the replacement gate approach, including the additional incorporation of the channel semiconductor material. In other cases, the process strategy may be applied to a plurality of different types of transistors, each of which may receive a different type of semiconductor channel region.

Figure 1N:
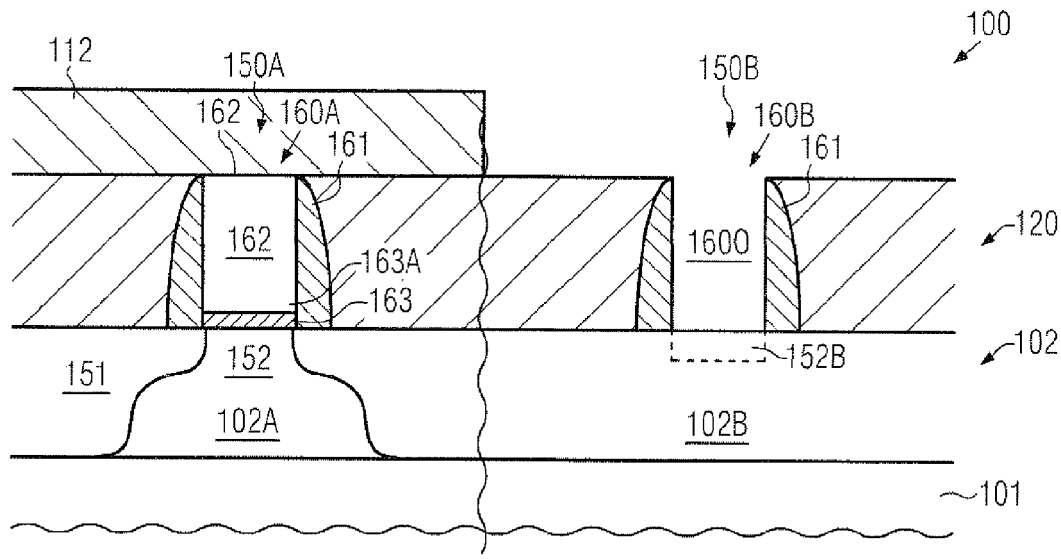
FIG. 1n schematically illustrates the semiconductor device according to further illustrative embodiments, in which the placeholder material of gate electrode structures of transistors of different type may be removed sequentially.

FIG. 1n schematically illustrates the semiconductor device 100 accordance to process strategies in which the selection of a channel semiconductor material may be performed on the basis of a process strategy, in which the placeholder materials of the gate electrode structures may be removed sequentially. As illustrated, the gate electrode structure 160A may be covered by a hard mask 112, such as an oxide mask, a silicon nitride mask and the like, and the placeholder material 162 may not have been removed, while the gate opening 160O may be provided in the gate electrode structure 160B. In this case, the further processing may be continued by, for instance, forming the recess 152B, if required, and depositing the channel semiconductor material, as is also previously described. Thereafter, in some illustrative embodiments, an appropriate dielectric material in combination with an electrode metal may be filled into the gate electrode structure 160B, while, in the gate electrode structure 160A, at least the placeholder material 162 is still present. In other cases, a hard mask may be formed in the gate electrode structure 160B after the deposition of the channel semiconductor material and the processing may be continued by removing the placeholder material 162 and forming a corresponding channel semiconductor material in the gate electrode structure 160A, as is also discussed above.

With reference to FIGS. 2a-2f, further illustrative embodiments will now be described in which process complexity upon providing a channel semiconductor material of different characteristics in different transistors may be reduced.

Figure 2A:
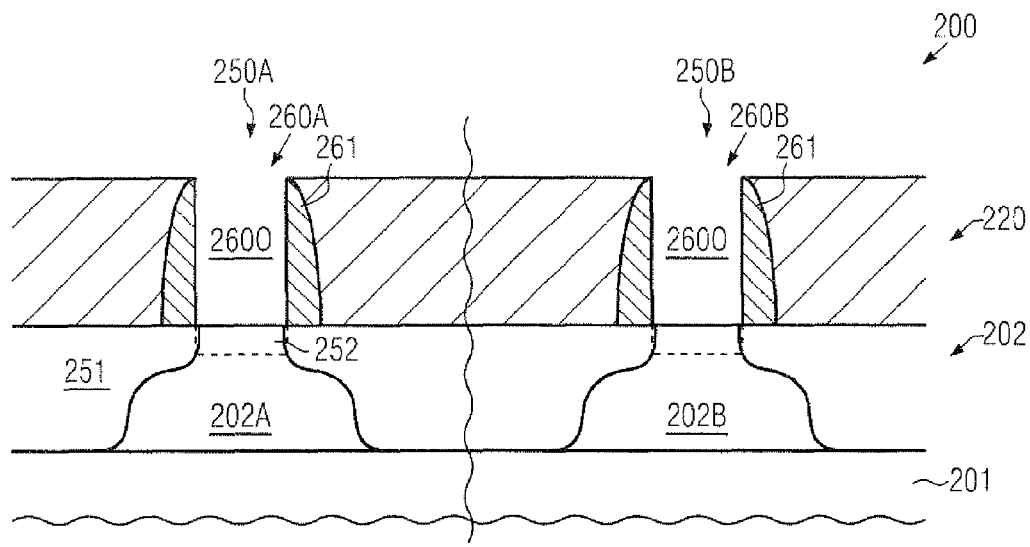
FIGS. 2a-2e schematically illustrate cross-sectional views of a semiconductor device during various manufacturing stages, in which different types of channel semiconductor materials may be provided in a replacement gate approach on the basis of a reduced process complexity, according to still further illustrative embodiments.

FIG. 2a schematically illustrates a semiconductor device 200 comprising a substrate 201 and a semiconductor layer 202, in which transistors 250A, 250B may be formed in and above corresponding active regions 202A, 202B. The transistors 250A, 250B may comprise gate electrode structures 260A, 260B. With respect to any characteristics of the component described so far, the same criteria apply as previously explained with reference to the device 100. In the manufacturing stage shown, the gate electrode structures 260A, 260B may comprise corresponding openings 260O so as to expose a portion 252 of the active regions 202A, 202B, respectively, wherein, as also previously discussed, the portion 252 may be provided in the form of a recess. In the embodiment shown, the exposed portion or recess 252 may have substantially the same configuration in each of the active regions 202A, 202B. To this end, the semiconductor device 200 may be formed on the basis of process strategies, as are also previously discussed with reference to the device 100 in order to form the gate electrode structures 260A, 260B and completing the basic configuration of the transistors 250A, 250B. After forming and planarizing a dielectric material 220, any placeholder materials in the gate electrode structures 260A, 260B may be removed in a common etch process, while, if required, also forming the recesses 252. Consequently, any masking processes may be avoided in this process stage.

Figure 2B:
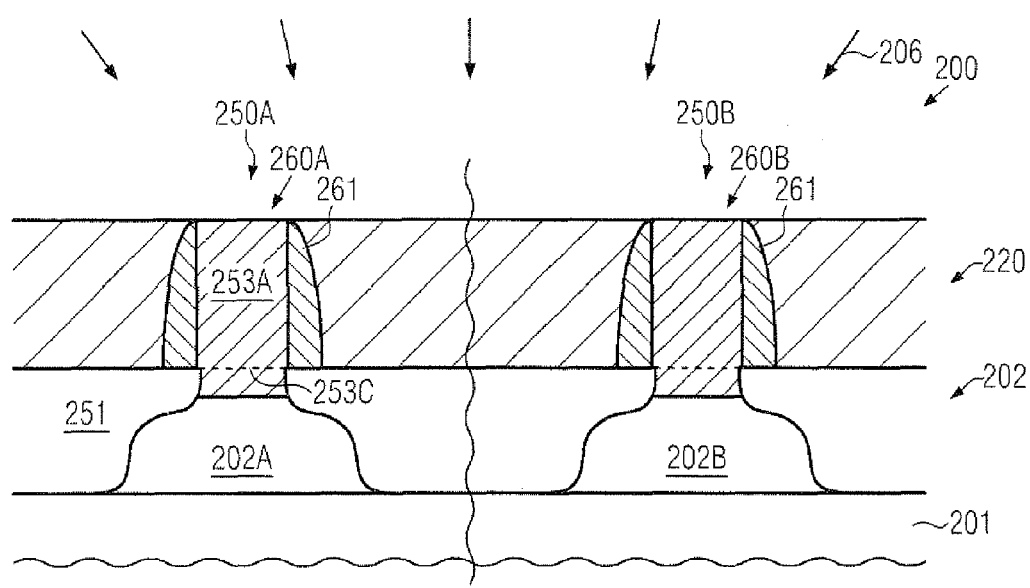

FIG. 2b schematically illustrates the device 200 according to some illustrative embodiments in which a selective epitaxial growth process 206 may be performed as a non-masked process, thereby depositing a channel semiconductor material 253A in the gate electrode structures 260A, 260B. In the embodiment shown, the material 253A may have appropriate characteristics so as to comply with the device requirements of the transistor 250A. With respect to any material characteristics and deposition strategies, it may also be referred to the deposition processes 106A and 106B, described above. Moreover, in some illustrative embodiments, during the deposition 206, an appropriate atomic species 253C may be incorporated at a desired height level so as to provide a material layer for a material portion having a significantly modified etch rate to enhance controllability of an etch process to be performed in a later manufacturing stage. For example, it is well known that a plurality of etch chemistries may sensitively respond to the presence of dopant species or any other atomic species incorporated into a basic semiconductor material. In other cases, the material composition per se may be appropriately changed so as to provide different etch characteristics at a certain height level within the gate electrode structure 260A, 260B. It should be appreciated that, in other cases, the material 253A may be grown to any desired height level, if the further processing on the basis of a pronounced surface topography may be considered appropriate.

Figure 2C:
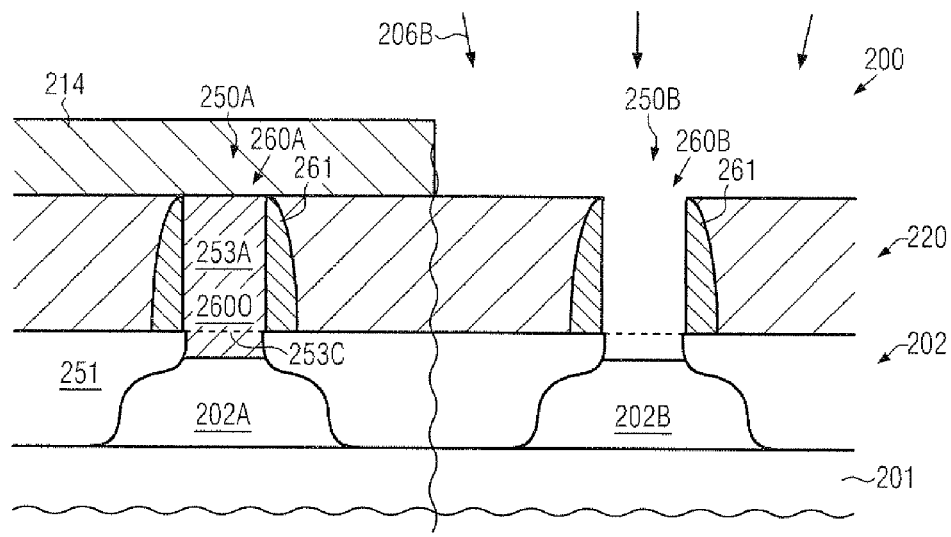

FIG. 2c schematically illustrates the semiconductor device 200 in a further advanced manufacturing stage. As illustrated, a mask 214 may be formed above the gate electrode structure 260A and may thus cover the material 253A, while the material 253A is removed from the gate electrode structure 260B. This may be accomplished on the basis of any wet chemical etch chemistry or plasma-assisted etch chemistry, wherein, if provided, the species 253C may be used for superior etch control. That is, the main portion of the material 253A in the gate electrode structure 260B may be etched by using the material 253C as an efficient etch stop material, and thereafter the reduced thickness of the material 253A may be removed on the basis of a time-controlled etch process and the like. Consequently, the mask 214 may be provided on the basis of a superior surface topography, thereby avoiding the formation and removal of any mask materials within the opening 260O of the gate electrode structure 260A. Thereafter, a further selective epitaxial growth process 206B may be applied so as to form a desired material in the gate electrode structure 260B, as is also previously discussed.

Figure 2D:
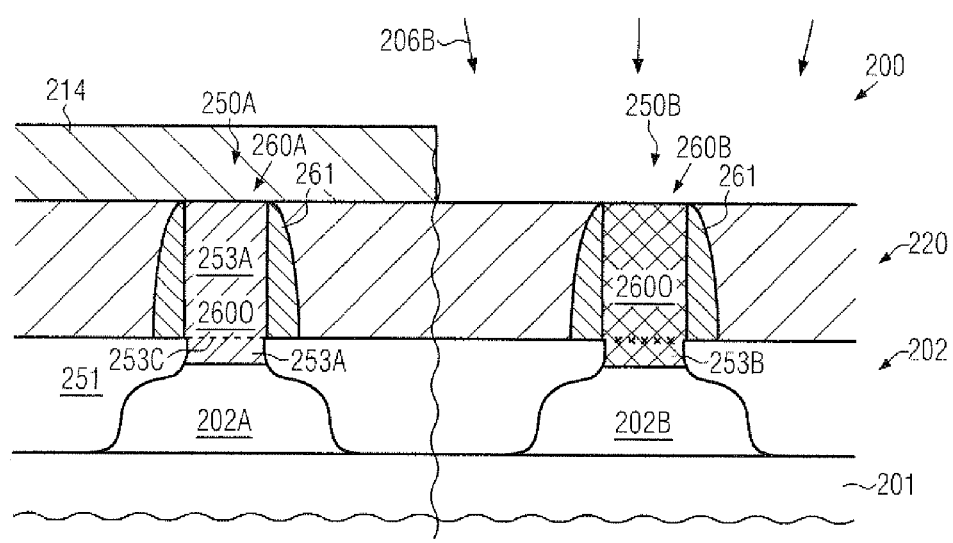

FIG. 2d schematically illustrates the device 200 with a channel semiconductor material 253B formed, at least in contact with the active region 202B, in accordance with the requirements of the gate electrode structure 260B, while excess material may be provided, for instance in the form of the material 253B or in the form of the material 253A, so as to obtain similar etch conditions during the subsequent processing of the device 200. Furthermore, if desired, the species 253C may be incorporated so as to provide superior control of a subsequent etch process. With respect to the characteristics of at least the material 253B, it may be referred to the embodiments described above. Next, the hard mask 214 may be removed, however, without affecting the materials 253A, 253B at the bottom of the gate openings 260O.

Figure 2E:
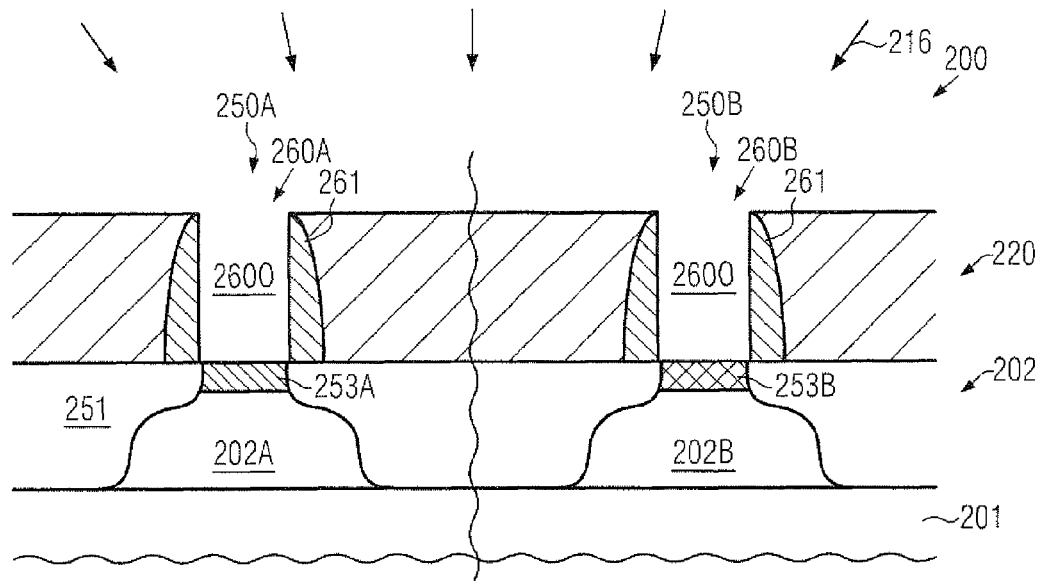

FIG. 2e schematically illustrates the semiconductor device 200 when exposed to a selective etch ambient 216 in order to remove any excess materials from the gate electrode structures 260A, 260B. To this end, any appropriate wet chemical or plasma-assisted etch recipe may be applied, wherein the etch process may be controlled on the basis of the etch time so as to preserve the desired portions 253A, 253B in the gate electrode structures 260A, 260B, respectively. In other cases, the species 253C (FIG. 2d) may be used for superior process control. As discussed above, the excess material in the gate electrode structures 260A, 260B may be provided with substantially the same material composition, thereby providing a highly uniform etch behavior. Consequently, based on the openings 260O, the processing may be continued by forming appropriate dielectric materials and electrode materials therein, as is, for instance, also described above with reference to the device 100. Thus, the materials 253A, 253B may be provided without requiring sophisticated masking steps within the gate openings 260O.

Figure 2F:
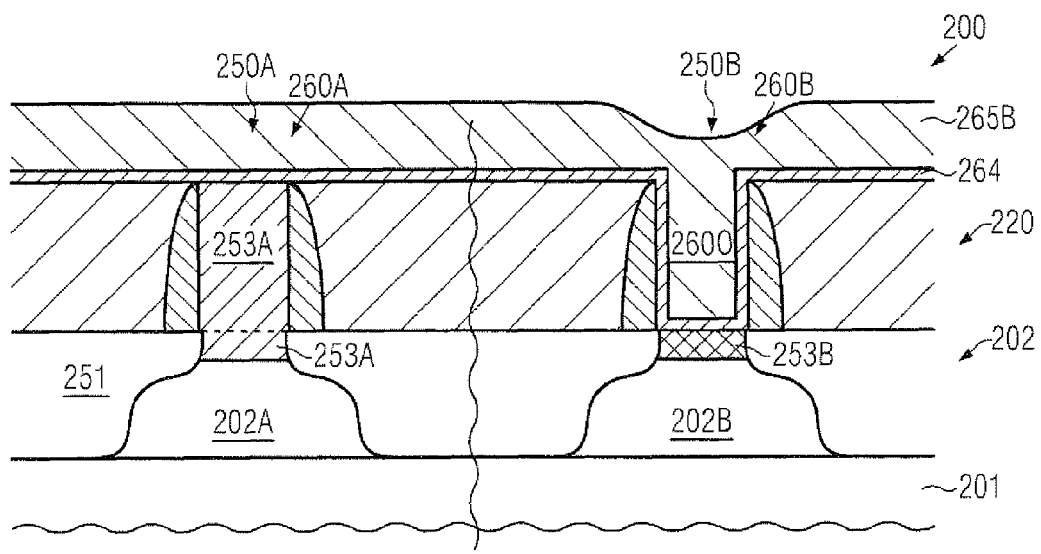
FIG. 2f schematically illustrates the semiconductor device according to illustrative embodiments in which the high-k dielectric material and a metal-containing electrode material may be provided sequentially for transistors of different types.

FIG. 2f schematically illustrates the semiconductor device 200 according to further illustrative embodiments in which, starting with the configuration as shown in FIG. 2c, i.e., with the mask 214 formed above the gate electrode structure 260A comprising the material 253A, the material 253B may be deposited in the opening 260O. Furthermore, a dielectric material 264, comprising a high-k dielectric material, may be deposited on the material 253B within the gate opening 260O of the gate electrode structure 260B. Next, an electrode material 265B may be formed in compliance with the requirements of the gate electrode structure 260B. Thereafter, any excess material may be removed so as to expose the material 253A of the gate electrode structure 260A. Next, a desired portion of the material 253A may be removed on the basis of any appropriate etch technique, wherein, in some illustrative embodiments, the process may be performed as a non-masked process using the material 265B in the gate electrode structure 260B as an etch stop material. Thereafter, appropriate dielectric materials and electrode materials may be formed in the gate electrode structure 260A in accordance with any appropriate process strategy. Consequently, in this case, no additional lithography step may be required for forming the gate electrode structures 260A, 260B comprising the different materials 253A, 253B, while, nevertheless, a substantially planar surface topography may be provided during the entire process sequence.

As a result, the present disclosure provides semiconductor devices and manufacturing techniques in which an appropriately configured channel semiconductor material may be provided upon applying a replacement gate approach, thereby providing superior flexibility in adjusting the overall device characteristics, for instance in terms of threshold voltage, drive current capability and the like. Due to the late epitaxial growth of the channel semiconductor material, a wide variety of materials may be used in the channel region and also as electrode materials in the gate electrode structures, since undue exposure to particular process conditions, such as high temperatures, may be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a gate electrode structure of a transistor on a semiconductor region, said gate electrode structure comprising a placeholder material;
removing said placeholder material so as to form a gate opening and thereby exposing a portion of said semiconductor region;
forming a channel semiconductor material on said exposed portion of said semiconductor region through said gate opening, wherein forming said channel semiconductor material comprises performing an epitaxial growth process and incorporating a dopant species in at least a portion of said channel semiconductor material during said epitaxial growth process;

forming a hard mask material above said channel semiconductor material;

forming an etch mask material above said hard mask material; and forming a gate dielectric material on said channel semiconductor material and an electrode material above said gate dielectric material within said gate opening.

2. The method of claim 1, wherein forming said channel semiconductor material comprises forming said channel semiconductor material in a strained state.

3. The method of claim 1, wherein forming said channel semiconductor material comprises forming a recess in said semiconductor region through said gate opening and forming said channel semiconductor material at least on said recess.

4. The method of claim 1, further comprising forming drain and source regions in said semiconductor region prior to forming said gate opening.

5. The method of claim 1, further comprising forming a second gate electrode structure of a second transistor on a second semiconductor region and forming a second channel semiconductor material on a portion of said second semiconductor region, wherein said second channel semiconductor material differs in at least one material characteristic from said channel semiconductor material formed on said portion of said semiconductor region.

6. The method of claim 5, wherein forming said second channel semiconductor material comprises forming a second gate opening in said second gate electrode structure and forming said second channel semiconductor material through said second gate opening while masking said gate opening.

7. The method of claim 1, wherein forming said gate dielectric material comprises forming a high-k dielectric material in said gate opening.

8. The method of claim 7, wherein forming said electrode material comprises forming a metal-containing conductive material on said high-k dielectric material.

9. A method of forming a semiconductor device, the method comprising:

forming a first channel semiconductor material on a portion of a first semiconductor region through a first opening formed in a first gate electrode structure;

forming a second channel semiconductor material on a portion of a second semiconductor region through a second opening formed in a second gate electrode structure, said first and second channel semiconductor materials differing in at least one material characteristic, wherein said first channel semiconductor material is formed prior to forming said second channel semiconductor material, and wherein forming said first and second channel semiconductor materials comprises incorporating a dopant species into at least a portion of at least one of said first and second channel semiconductor materials during a deposition process;

forming a hard mask material above said channel semiconductor material;

forming an etch mask material above said hard mask material; and forming a gate dielectric material and an electrode material in said first and second openings.

10. The method of claim 9, further comprising forming a first recess in said first semiconductor region and a second recess in said second semiconductor region, wherein said first channel semiconductor material is formed in said first recess and said second channel semiconductor material is formed in said second recess.

11. The method of claim 9, further comprising forming said first opening in said first gate electrode structure prior to forming said second opening in said second gate electrode structure.

12. The method of claim 9, wherein forming a gate dielectric material and an electrode material in said first and second openings comprises forming said gate dielectric material in said first and second openings, forming a first metal-containing material in said first and second openings, removing said first metal-containing material selectively from said second opening and forming a second metal-containing material in said first and second openings.

13. The method of claim 9, wherein said first and second channel semiconductor materials are formed so as to differ in their strain state.

14. The method of claim 9, further comprising forming drain and source regions in said first and second semiconductor regions prior to forming said first and second recesses.

* * * * *